(12) United States Patent
Ham et al.

(10) Patent No.: US 7,248,340 B2
(45) Date of Patent: Jul. 24, 2007

(54) LITHOGRAPHIC APPARATUS AND PATTERNING DEVICE TRANSPORT

(75) Inventors: Erik Leonardus Ham, Rotterdam (NL); Robert Gabriël Maria Lansbergen, Schiedam (NL); Ellart Alexander Meijer, Haarlem (NL); Hendricus Johannes Maria Meijer, Veldhoven (NL); Hans Meiling, Waalre (NL); Bastiaan Matthias Mertens, The Hague (NL); Johannes Hubertus Josephina Moors, Helmond (NL); Gert-Jan Heerens, Schoonhoven (NL)

(73) Assignee: ASML Netherlands B.V., Veldhoven (NL)

( * ) Notice: Subject to any disclaimer, the term of this patent is extended or adjusted under 35 U.S.C. 154(b) by 148 days.

(21) Appl. No.: 10/874,690

(22) Filed: Jun. 24, 2004

(65) Prior Publication Data

US 2005/0286041 A1    Dec. 29, 2005

(51) Int. Cl.
*G03B 27/42* (2006.01)
*G03B 27/62* (2006.01)

(52) U.S. Cl. .......................................... 355/75; 355/53
(58) Field of Classification Search ................ 355/75, 355/77, 53; 206/710; 414/217; 55/356
See application file for complete search history.

(56) References Cited

U.S. PATENT DOCUMENTS

| | | | |
|---|---|---|---|
| 5,843,196 A * | 12/1998 | Leavey et al. | 55/356 |
| 6,267,123 B1 * | 7/2001 | Yoshikawa et al. | 134/62 |
| 6,619,903 B2 * | 9/2003 | Friedman et al. | 414/331.14 |
| 2006/0078407 A1 * | 4/2006 | del Puerto et al. | 414/217 |

* cited by examiner

*Primary Examiner*—Rodney Fuller
(74) *Attorney, Agent, or Firm*—Pillsbury Winthrop Shaw Pittman LLP

(57) ABSTRACT

A transport box for transporting a lithographic patterning device and a lithographic apparatus adapted to cooperate with the transport box are presented. The transport box is provided with a container part having an inner space with a storing position for storing the patterning device and an opening for the transfer of the patterning device. The box also includes a closure part for closing the opening, and a channel system for evacuating and/or feeding gasses from/to the inner space the box.

11 Claims, 7 Drawing Sheets

LITHOGRAPHIC APPARATUS AND PATTERNING DEVICE TRANSPORT

BACKGROUND OF THE INVENTION

1. Field of the Invention

The present invention relates to a box for transporting a lithographic patterning device, the box being arranged for cooperation with an associated lithographic apparatus for the mutual exchange of the patterning device as well as a method of using the transport box.

2. Description of the Related Art

A lithographic apparatus is a machine that applies a desired pattern onto a target portion of a substrate. Lithographic apparatus can be used, for example, in the manufacture of integrated circuits (ICs). In that circumstance, a lithographic patterning device, which is alternatively referred to as a "mask" or "reticle," may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (i.e., resist).

In general, a single substrate will contain a network of adjacent target portions that are successively exposed. Known lithographic apparatus include so-called steppers, in which each target portion is irradiated by exposing an entire pattern onto the target portion in one go, while in so-called scanners, each target portion is irradiated by scanning the pattern through the projection beam in a given direction (the "scanning"-direction) while synchronously scanning the substrate parallel or anti-parallel to this direction.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning means include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

Generally, such patterning devices are transported from one location to another via a transport box, which are readily known and widely used. The transportation can take place between a stock of patterning devices and a lithographic apparatus. When the patterning devices are located inside the box, transportation is possible while the patterning devices are protected against outside contamination (e.g., organic contamination, Si-particles, metal particles, chemical contamination, molecular contamination, dust particles, etc.).

After transportation, the patterning devices can be transferred from the box to the lithographic apparatus. Afterwards, further transportation is performed by a pick and place machine (i.e., placing equipment) to a reticle stage/table/holder that holds the patterning device while an exposure beam of radiation exposes substrates or wafers.

According to a conventional method of exchanging patterning devices, the transport box loaded with the patterning device is coupled to the lithographic apparatus. The coupling is facilitated by an arrangement in which a door of the box, carrying the patterning device, is coupled to a door of the lithographic apparatus that is, in turn, coupled to an elevator mechanism. After the coupling, the elevator with the doors is lowered and the patterning device enters the lithographic apparatus for further transport into the reticle stage.

In this conventional method, the inner space of the box is under atmospheric pressure (about 1 bar), during the exchange of the patterning device, such that gas from the box enters the lithographic apparatus when the elevator mechanism lowers the patterning device.

SUMMARY OF THE INVENTION

A disadvantage of the conventional method described above, is that gas from the inner space of the box may enter the inner space of the lithographic apparatus while transferring the patterning device into the lithographic apparatus. As such, contamination particles may be blown by swirling gas into the lithographic apparatus.

The principles of the present invention, as embodied and broadly described herein, provide for a patterning device transport box that minimizes the chances of contaminating the lithographic apparatus. In one embodiment, a box for transporting a lithographic patterning device is presented, the box being arranged to cooperate with a lithographic apparatus for the transfer of the patterning device, the box comprises a container part having an inner space with a storing position to store the patterning device and an opening for transferring the patterning device; a closure part for closing the opening; and a channel system configured to evacuate gases from/to the inner space of the box and/or to feed gases to/from the inner space of the box.

Preferably, the patterning device transport box is provided with a vacuum seal between the container part and the closure part for providing an essentially gas tight closing by the closure part. Accordingly, an evacuating device can be connected to the channel system of the box such that it can be pumped vacuum (if the opening is closed by the closure part) before the inner spaces of the lithographic apparatus and the box are connected.

Consequently, during the connection, the gas flow between the inner spaces is zero or at least minimal. This minimizes the chances that contaminating particles are blown into the lithographic apparatus. In addition, since the vacuum condition of the inner space of the lithographic apparatus is hardly influenced during the connection, there is no loss of time in regaining the vacuum condition such that the throughput of the apparatus is optimal.

For specific lithographic applications, such as Extreme UltraViolet (EUV) lithographic exposure processes, vacuum conditions are required. According to an embodiment of the invention, it is then advantageous to use a load lock in a vacuum condition which can form part of the lithographic apparatus. The patterning device can be transferred from the evacuated box into the load lock without bringing gas into the inner space of the load lock. The result is that the inner space of the load lock remains essentially vacuum such that no serious time delay is introduced in regaining the vacuum condition of the load lock.

The patterning device can be transferred from the box, via the load lock, into a further vacuum inner space of the lithographic apparatus (where a reticle stage can be located). In case of EUV applications the further inner space of the lithographic apparatus is in a vacuum condition. Transportation from the load lock to the reticle stage in the lithographic apparatus can be performed without the necessity of overcoming large pressure differences which would otherwise cause relatively large time delays. Consequently, the throughput of the lithographic apparatus is optimized.

Preferably, the channel system comprises an output channel for evacuating gasses from the box. The output channel can be provided with an output valve for closing the channel (for example when no evacuating device is connected to the channel). Furthermore, it is advantageous if the output channel is provided with a contamination filter in order to prevent contamination particles to enter the inner space of the box.

Preferably, the channel system also comprises an input channel connecting the inner space with for example an external feeding (venting) device for feeding (venting) gas to the inner space. In principle the input and output channel can be combined.

The input channel may be provided with an input valve for closing the input channel. The input channel yields the possibility of bringing the inner space of the box under a certain overpressure, wherein the input channel is closed by the input valve. For example, during transport of patterning device in the inner space of the box the inner space can be kept under overpressure with a suitable gas, and, just before transferring the patterning device into the lithographic apparatus, the inner space can be evacuated to obtain a vacuum condition in the box. It is advantageous if the input channel is separated from the output channel such that it is possible to achieve the same gas flow direction for both evacuating and venting (see description in relation to same direction of gas flow directed away from the pattern on the patterning device both during evacuating and during feeding gasses) and if the input channel is provided with a particle filter.

According to an embodiment of the invention, the inner space of the box is provided with a separation member including a gas permeable sheet, which separation member defines a first and a second compartment in the inner space of the box in closed condition, wherein the separation member provides protection for the patterning device when placed in the position in the second compartment against possible contamination from the first compartment. The separation member can be fixed to the inner walls of the box.

Preferably, the channel system is arranged such that an input channel of the channel system flows into the first compartment, and the output channel flows out from the second department. Then, the direction of the gas flow during evacuating is the same as the direction of the gas flow during venting such and the chance of particle contamination introduced by the gas flow is less than in cases where the directions are different during evacuating and venting.

Mostly, EUV patterning devices are clamped in the box against a reticle holder, wherein the side of the patterning device with the pattern is facing downwards. The separation member can be oriented substantially horizontal defining the first compartment to be located above the second compartment. Then, the gas flow through the input channel into the box is directed from the upper side to the lower side of the box. Also, the gas flow through the output channel is directed from the upper side to the lower side of the box, thus in the same direction as the gas flow via the input channel. This is an advantageous direction of the gas flow, since it is directed away from the pattern on the patterning device, thereby reducing the risk of swirling contamination particles in the second compartment contaminating the pattern of the patterning device is optimally reduced.

An additional advantage of the use of the separation member with the gas permeable sheet is that it yields a gentle gas flow during venting/evacuating through the box such that the chance on knocked loose contamination particles is minimal.

The invention also relates to a lithographic apparatus for cooperation with a patterning device transport box, according to the invention, wherein the lithographic apparatus is arranged to be coupled to the box such that a respective first and second channel of the lithographic apparatus are respectively connected to the input channel and the output channel, wherein the respective first and second channel are provided with a respective first and second valve. The lithographic apparatus can be arranged such that the input and output valves are automatically opened during the coupling of the box and the lithographic apparatus.

An embodiment of the lithographic apparatus according to the invention is presented in which the lithographic apparatus is provided with a control system for controlling the first valve, the second valve, a feeding device coupled to the first channel and an evacuating device coupled to the second channel, such that during the coupling the box can be evacuated by the evacuating device after opening the second valve and/or vented by the feeding device after opening the first valve. Herewith, the control system can be arranged to control the valves and devices such that the gas flow during evacuating and during venting is in the direction from the first compartment to the second compartment.

The invention also relates to a lithographic apparatus having a load lock provided with the said channel system of the lithographic apparatus, such that the load lock is arranged for cooperation with the box.

Furthermore, the invention relates to a method for transferring patterning device from a box to a lithographic apparatus comprising evacuating gas from an essentially gas tight sealed inner space of the transport box loaded with the patterning device, for obtaining a first vacuum condition in the inner space; providing an inner space of the lithographic apparatus in a second vacuum condition; connecting the inner space of the Box via a patterning device transfer opening with the inner space of the lithographic apparatus, wherein the connected inner spaces are essentially gas tight sealed from an external environment; and transferring the patterning device from the inner space of the box through the patterning device transfer opening to the inner space of the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc.

The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The support structure supports, i.e., bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Apparatus

Figure 1:
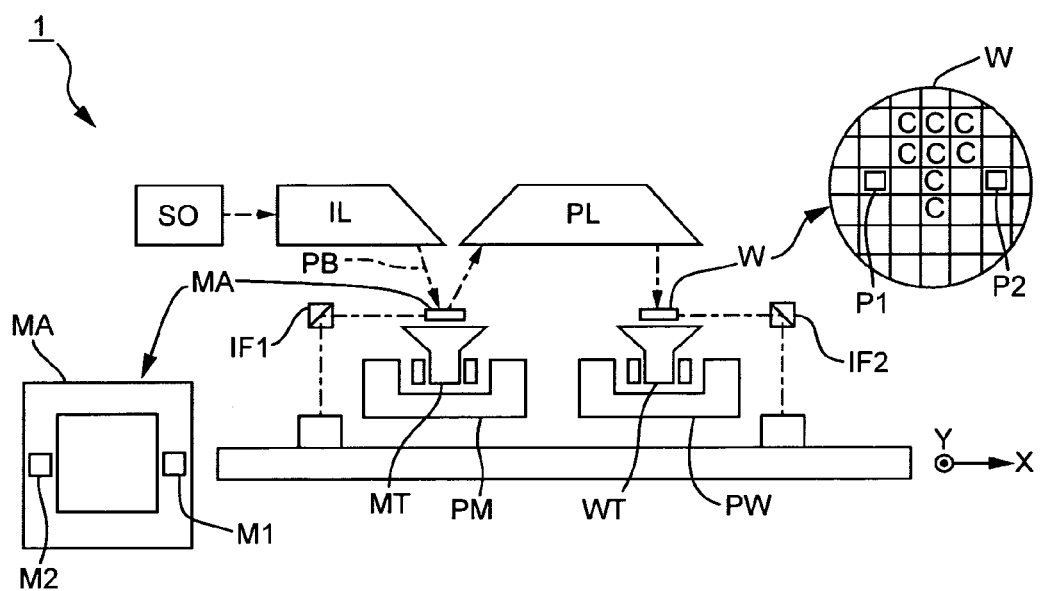
FIG. 1 depicts a lithographic apparatus according to an embodiment of the invention.

FIG. 1 schematically depicts a lithographic apparatus 1 according to an embodiment of the invention. The apparatus 1 comprises:

an illumination system (illuminator) IL: for providing a projection beam PB of radiation (e.g., UV or EUV radiation).

a first support structure (e.g., a mask table/holder) MT: for supporting patterning device (e.g., a mask) MA and coupled to first positioning mechanism PM for accurately positioning the patterning device with respect to item PL;

a substrate table (e.g., a wafer table/holder) WT: for holding a substrate (e.g., a resist-coated wafer) W and coupled to second positioning mechanism PW for accurately positioning the substrate with respect to item PL; and a projection system (e.g., a reflective projection lens) PL: for imaging a pattern imparted to the projection beam PB by patterning device MA onto a target portion C (e.g., comprising one or more dies) of the substrate W.

As here depicted, the apparatus is of a reflective type (e.g., employing a reflective mask or a programmable mirror array of a type as referred to above). Alternatively, the apparatus may be of a transmissive type (e.g., employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting mechanism for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning mechanism PW and position sensor IF2 (e.g., an interferometric device), the substrate table WT can be moved accurately, e.g., so as to position different target portions C in the path of the beam PB. Similarly, the first positioning mechanism PM and position sensor IF1 can be used to accurately position the mask MA with respect to the path of the beam PB, e.g., after mechanical retrieval from a mask library, or during a scan. In general, movement of the object tables MT and WT will be realized with the aid of a long-stroke module and a short-stroke module, which form part of the positioning mechanism PM and PW. However, in the case of a stepper (as opposed to a scanner) the mask table MT may be coupled to a short stroke actuator only, or may be fixed. Mask MA and substrate W may be aligned using mask alignment marks M1, M2 and substrate alignment marks P1, P2.

The depicted apparatus can be used in the following preferred modes:

step mode: the mask table MT and the substrate table WT are kept essentially stationary, while an entire pattern imparted to the projection beam is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

scan mode: the mask table MT and the substrate table WT are scanned synchronously while a pattern imparted to the projection beam is projected onto a target portion C (i.e., a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Transport Box and Lithographic Apparatus

The lithographic apparatus 1 (FIG. 1, FIG. 2A, FIG. 2B) is to be provided with patterning device MA, 4 containing the lithographic pattern to be exposed onto the wafer W. The transport box 2 can be used for transportation of lithographic patterning device MA, 4. Examples of patterning devices are EUV masks or EUV reticles. The transport box 2 can hold one or more reticle(s) (e.g., a number of vertically-stacked reticles). The patterning devices MA, 4 are protected by the box against contamination such as organic, chemical, molecular contamination.

For Extreme Ultraviolet (EUV) applications there are disadvantages in applying a pellicle. A pellicle is a transparent member that can be placed on the patterning device (on the pattern) in order to keep possible contamination at distance from the pattern present on the patterning device. The application of such a pellicle is avoided for EUV applications. The absence of the pellicle implicates that extra measures have to be applied which reduce the presence and risks of contamination particles on the patterning device. An important measure is that the patterning devices are transported to the lithographic apparatus 1 in the box 2 in such a way that the patterning device MA, 4 are not contaminated during transport.

In this example, the transport box 2 (see, FIGS. 2A, 2B) has the form of a block (i.e., rectangular cross-section), although it will be appreciated that other forms, such as, for example, pill-forms, cylindrical forms, are also possible. The box 2 can be made of many kinds of metals, synthetic materials or combinations thereof. Possible choices of metals are aluminum and titanium. In this example, the construction is such that it can resist vacuum forces with a sufficient degree of vacuum stiffness.

Figure 2A:
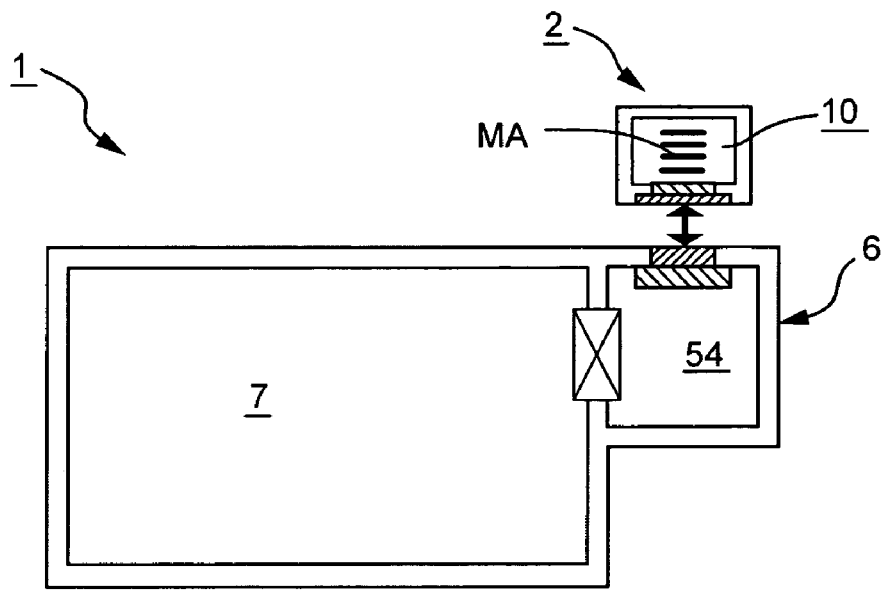
FIG. 2A is a schematic side view of a box according to the invention and a lithographic apparatus provided with a load lock according to the invention.

FIG. 2A depicts a configuration, in accordance with an embodiment of the present invention, comprising a box 2 that is capable of cooperating with a load lock 6 of the lithographic apparatus 1 for transferring or exchanging the patterning device MA, 4. The box 2 can hold one or more masks or reticles. In this example, the patterning device can be transported from the box 2 into the further inner space 7 of the lithographic apparatus 1 via the load lock 6.

Figure 2B:
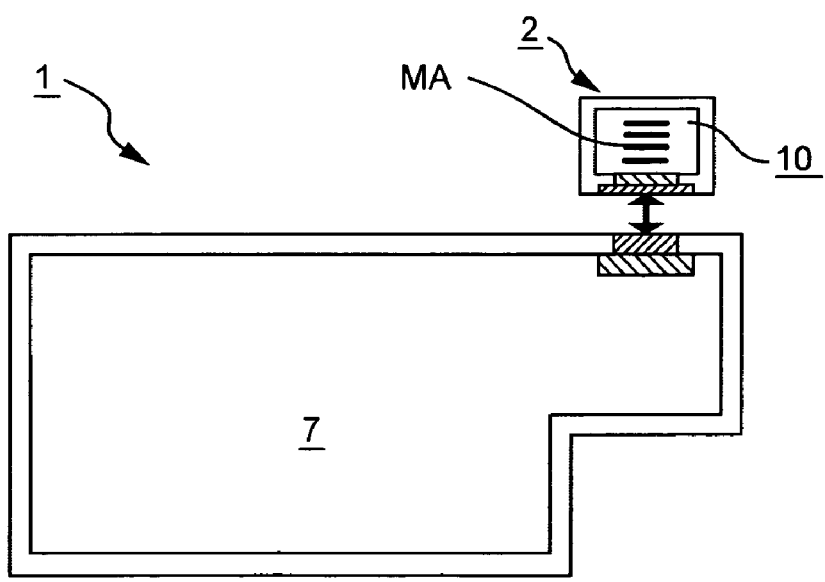
FIG. 2B is a schematic side view of a box according to the invention and a lithographic apparatus according to the invention.

FIG. 2B provides another configuration, in accordance with an embodiment of the present invention, comprising a box 2 that cooperates with the lithographic apparatus 1 without a load lock. Although, such a configuration works well, the previous configuration (see, FIG. 2A) may be preferred because it offers an advanced vacuum feed-through of the patterning device MA, 4 via the lock 6 into the further inner space 7 of the lithographic with enhanced protection against contamination. The further inner space 7 may encompass the area where the exposure-related components of the lithographic apparatus 1 are located, such as, for example, projection system, substrate holder/table, etc. (see discussion above). Typical volumes for the spaces can be the following: $10^{-4}$ $m^3$ of the inner space of the transport box; $10^{-2}$ $m^3$ of the inner space of the load lock 6; and 5 $m^3$ of the further inner space 7 of the lithographic apparatus.

Figure 3A:
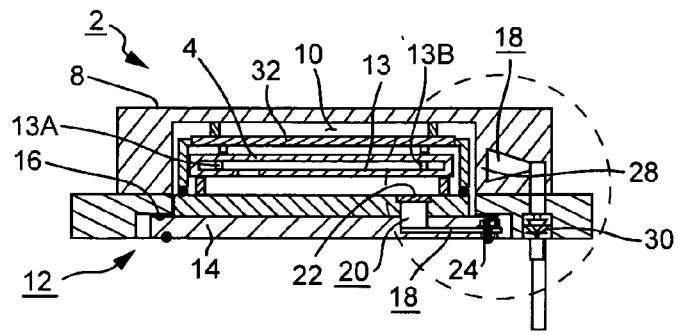
FIG. 3A is a schematic side view of a vertical oriented cross section of a box according to the invention, wherein the box comprises patterning device.

Hereafter, the configuration according to FIG. 2A will be explained in more detail. As shown in FIG. 3A, the transport box 2 is provided with a container part 8 having an inner space 10 for storing the patterning device 4 in a storing position and an opening 12 for transferring/exchanging the patterning device 4. The box 2 also comprises a closure part 14 for closing the opening 12. In this example the opening is at the bottom side, but it will be appreciated that a front side opening or an opening at the upper side can also be applied. The patterning devices 4 are held by a table 13 provided with carrying pins 13A, 13B for carrying the patterning device 4. As such, the carrying pins 13A, 13B define the storage position.

Figure 3B:
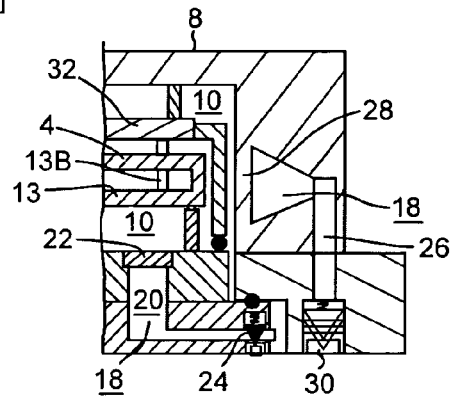
FIG. 3B is a detailed view of a portion of FIG. 3A.

As shown in FIG. 3A, the transport box 2 is provided with a vacuum seal 16 located between the container part 8 and the closure part 14. The vacuum seal 16 can be a resilient member which fits in a recess or recesses of the container part 8 and/or the closure part 14. The box 2 is provided with a channel system 18 for evacuating gasses from the inner space 10 as well as for venting gasses into the inner space 10. The channel system 18 is indicated clearly in FIG. 3B.

How the channel system 18 is used with respect to the transport box 2 in cooperation with the load lock 6 in transporting the patterning device 4 to and from the further inner space 7 (i.e., where the exposure-related components are located) of the lithographic system 1, will be explained in greater detail below.

The channel system 18 of the transport box 2 comprises an output channel 20 connected to the inner space 10. The output channel 20 can be connected with an external evacuating device for evacuating gas from the inner space 10. Thus, the box 2 can be pumped into a vacuum condition. In this example, the output channel 20 is provided with a particle filter 22 for preventing the inner space 10 from being contaminated with particles via the output channel 20. It is noted that, in this example, the output channel 20 has an output valve 24 for closing the output channel when it is not connected to the external device. Thus, the box 2 can maintain the vacuum condition when it is not connected to the evacuating device since the closure part 14 performs a vacuum tight seal to the container part 8 when the opening 12 is in a closed condition, and the valve 24 can be closed when the box is not connected to the evacuating device.

The channel system 18 comprises an input channel 26 connected to the inner space 10. The input channel 18 is connectable to an external feeding device for feeding gas to the inner space 10. This is called venting (or feeding) of the box 2 in which the condition of the inner space 10 can be transformed from a vacuum condition into a condition with a higher gas pressure, such as an atmospheric condition (1 Bar). Preferably, the input channel 26 is provided with a particle filter 28 and an input valve 30 for closing the input channel 26 when it is not connected to the external feeding device. Generally, the transport box 2 will be vented with clean gas, but even if there are contamination particles in that gas, then the filter 28 can prevent these particles to enter the inner space 10.

Figure 5A:
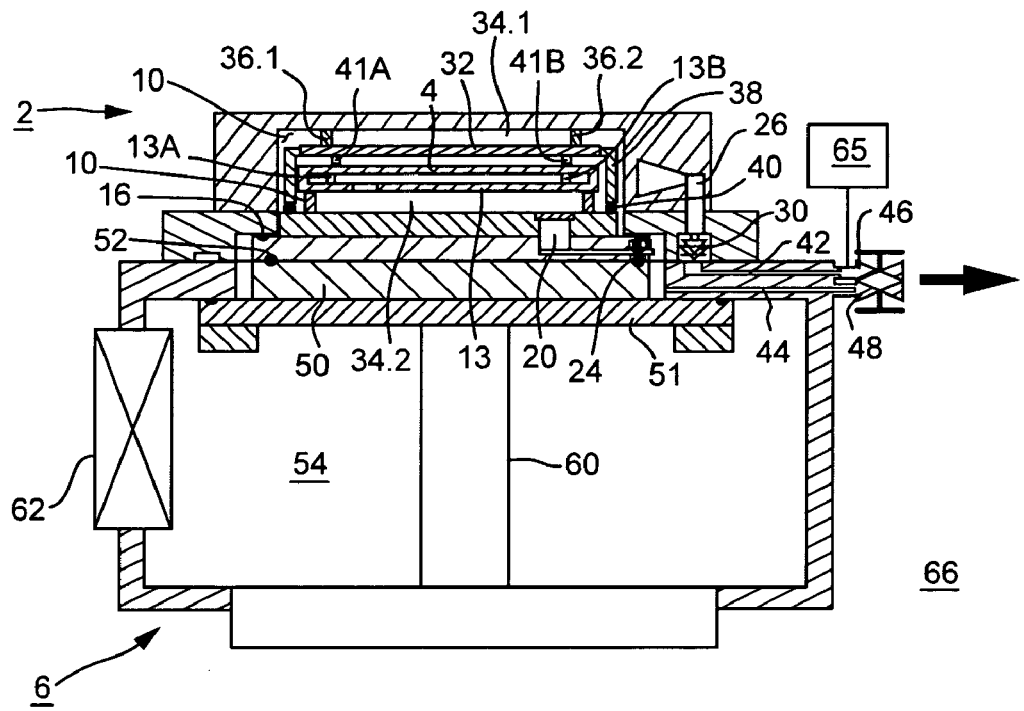
FIG. 5A is a schematic side view of a vertical oriented cross section of a system comprising the box according to FIG. 3A coupled with the load lock according to FIG. 4A, depicted in a situation wherein the box is being evacuated.

As depicted in FIG. 5A, the inner space 10 of the transport box 2 is provided with a separation member 32, which in this example, comprises a gas permeable cover sheet. The gas permeable cover sheet is arranged to be able to filter out particles with dimensions greater than 50 nm (note that sheets which can filter out all particle with larger dimensions than 20-50 nm can also be applied). The separation member 32 defines a first compartment 34.1 and a second compartment 34.2 in the inner space 10 of the box 2 when the box 2 is in closed condition. The separation member 32 provides protection for the patterning device 4 when placed in the storage position in the second compartment 34.2 against possible contamination in the first compartment 34.1. The gas permeable cover sheet can also offer protection against contamination particles/molecules which unfortunately have entered into the first compartment 34.1 (contamination particles which, for example, have passed the vacuum seal 16). The permeable cover sheet 32 is mounted to the ceiling of the container 8 via connection members 36.1, 36.2.

Furthermore, the separation member 32 is attached to an inner wall part 38, which presses against the closure part 14 via a resilient seal 40. The seal 40 generally will not have to withstand large pressure differences (large is in the order of magnitude about 1 Bar) such that it is advantageously to apply a hollow O-formed (in cross section) or a V-shaped (in cross section) (low stiffness) seal which offers a good shield against contamination particles. The separation member 32, the wall part 38, and the seal 40 form a particle tight separation within the inner space 10 yielding the compartments 34.1 and 34.2. Attached to the separation member 32 are distance keepers 41A, 41B, which maintain a distance between the sheet 32 and the patterning device 4 by pressing the patterning device 4 on the carrying pins 13A, 13B for preventing the patterning device 4 from rattling during transport.

As shown in FIG. 5A, the channel system 18 is arranged such that the input channel 26 flows into the first compartment 34.1 and the output channel 20 flows out from the second department 34.2. Furthermore, the separation member 32 is oriented substantially horizontal such that the first compartment 34.1 is located above the second compartment 34.2. As explained in more detail below, such a configuration offers a favorable direction of the gas flow, both during evacuating and venting, from the upper part of the inner space 10, through the permeable sheet of the separation member 32, towards the bottom part of the inner space 10. The permeable sheet yields a relatively smooth gas flow, wherein it is mentioned that this is advantageously since the smoother the gas flow the smaller the risk of knocked loose contamination particles which can contaminate the patterning device 4.

The invention also relates to a load lock 6 (see FIG. 4A) that cooperates with the transport box 2, in accordance with an embodiment of the present invention. The load lock 6 can be part of an apparatus, such as a lithographic apparatus, a patterning device stocking apparatus, a contamination-particle-scanner, a cleaning unit, etc. The load lock 6 is arranged to be coupled to the transport box 2 such that the channel system 18 of the box 2 is connected to a channel system of the load lock 6. The coupling of the channel systems is such that the respective input channel 26 and output channel 20 of the transport box 2 are coupled to a respective first channel 42 and second channel 44 of the channel system of the load lock 6 (see FIG. 5A). The respective first and second channels 42, 44 are preferably provided with a respective first valve 46 and second valve 48.

During the coupling of the transport box 2 with the load lock 6, the closure part 14 is coupled to a closure member 50 for closing an opening 51 of the load lock 6. The outer part of the closure member 50 can be provided with a vacuum seal 52 which, after coupling, defines a space between the closure part 14 and the closure member 50. In one embodiment, gas present in this space is evacuated such that a very thorough coupling is established. Preferably, a mechanical coupling is also performed which secures that the closure part 14 and the closure member 50 so that they are kept pressed against each other even when these are brought in a vacuum environment such as the inner part 54 of the load lock 6. The cooperation between the transport box 2 and the load lock 6 is explained into more detail hereinafter.

Figure 5B:
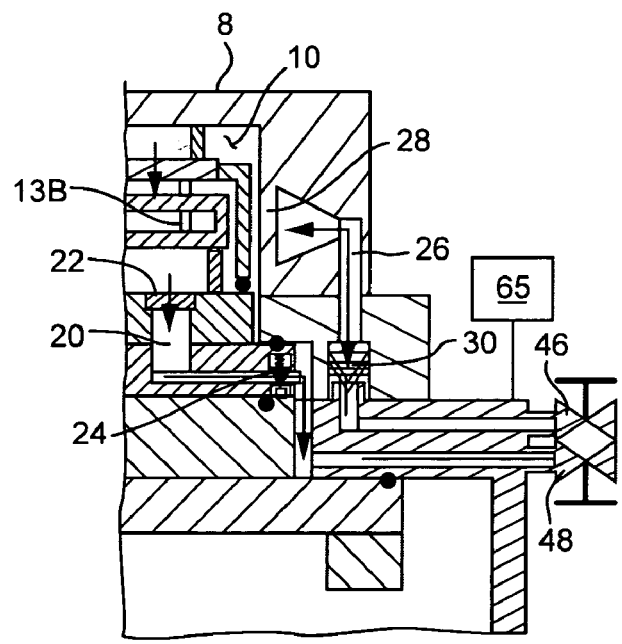
FIG. 5B is a detailed view of a portion of FIG. 5A.
Figure 6:
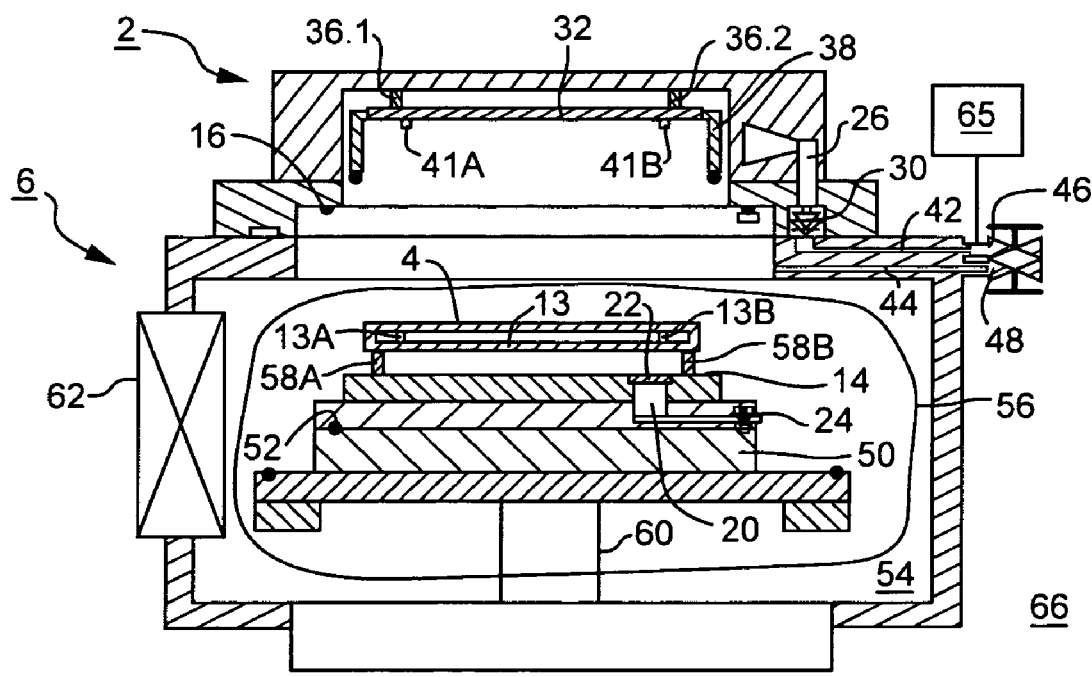
FIG. 6 is a schematic side view of the system according to FIG. 5A, depicted in a situation wherein the patterning device are transferred from the box into the load lock.

FIG. 6 illustrates the situation where, after the coupling of the transport box 2 to the load lock 6, the ensemble 56 including the patterning device 4, the table 13, carrying elements 58A, 58B, the closure part 14, and the closure member 50 are lowered into the inner space 54 of the load lock 6. The lowering of the ensemble 56 is performed by an elevator mechanism 60 which is schematically indicated in FIG. 5. The inner space 54 is generally kept in a vacuum condition.

The load lock 6 is provided with placing equipment 62, which comprises a gripper arm 64 (see FIG. 7), that transports the table 13 with the patterning device 4 from the load lock inner space 54 to an exposure unit of the lithographic apparatus 1 (e.g., located within the further inner space 7). During transportation, the gripper arm 64 can move under the table 13 and lift the table with the patterning device 4 from the carrying elements 58A, 58B.

The load lock 6 can be provided with an additional vacuum lock (transfer passage) through which the table 13 with the patterning device 4 are fed during the transportation between the inner part 54 and the exposure unit. After being used in the exposure unit, the placing equipment can transport the table 13 with the patterning device 4 back on the carrying elements 58A, 58B.

Figure 8A:
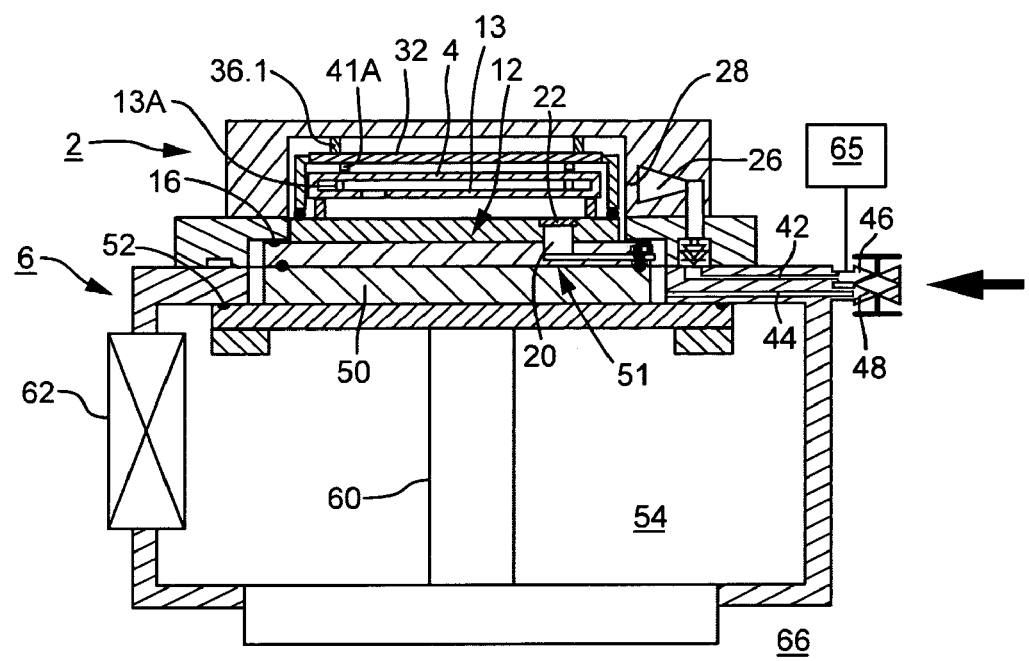
FIG. 8A is a schematic side view of the system according to FIG. 5A, depicted in a situation wherein a patterning device has been fed via the load lock into the box and the box is being vented.

FIG. 8A schematically depicts a situation where the elevator mechanism 60 has lifted the ensemble 56 such that the opening 12 of the box 2 and the opening 51 of the load lock are closed and the patterning devices 2 are transferred into the transport box 2.

The load lock 6 is provided with a control system 65 for controlling the first valve 46, the second valve 48, an evacuating device coupled to the first channel 42 and a feeding device coupled to the second channel 44, such that during the coupling, the box 2 can be evacuated by the evacuating device after opening the second valve 48 and/or vented by the feeding device after opening the first valve 46. as discussed under operation hereinafter in more detail. The control system 65 is arranged to control the valves and devices such that the gas flow during evacuating and during venting is in the direction from the first compartment 34.1 to the second compartment 34.

The transport box 2 and the load lock 6 can be provided with connection alignment means, including for example, mechanical notches and/or a combination of a magnet and magnet-detector for checking and assuring that the connection of the box 2 and the load lock 6 is performed such that they are in a pre-determined mutual position. In this way, a proper coupling can be assured in order to keep a good vacuum seal of the inner spaces of the box 2 and the load lock 6 on the one hand and the external environment 66 on the other hand.

Furthermore, a check on the proper coupling is also important for safety reasons. For example, the elevator mechanism 60 can be controlled by signals from the alignment means ensuring that it is only activated when the proper coupling has been established. This way, no unexpected movements of the elevator mechanism 60 are made if it is not connected properly to the box 2.

Hereinafter, the operation of the box 2 and the load lock 6 will be described based on the detailed constructional explanation, provided above.

Operation of the Box and the Load Lock

The patterning device 4 can be placed in the inner space 10 during transportation of the box 2, wherein the inner space 10 can be filled with a suitable gas such as nitrogen or argon. Patterning devices 4 are usually transported under atmospheric condition in the inner space 10 of the box 2. However, the inner space can be put under an overpressure (for example under 100 Bar) during transport, so that the chances that contaminating particles enter the inner space 10 from the external environment 66 is reduced by the overpressure.

Alternatively, it is also possible to transport the patterning device 4 under vacuum conditions in the inner space 10. In this case, the inner space is essentially gas-tight sealed in order to prevent contamination particles to enter the inner space 10. Then, there is generally no need to evacuate the inner space 10 before connecting the inner space 10 to the inner space 54 of the load lock. This means that the evacuating operation, as described in more detail below, can be omitted.

After transportation, the patterning devices 4 are transferred from the transport box 2 to the load lock 6 according to:

coupling transport the box 2 with the load lock 6 (see FIG. 5A);

evacuating the inner space 10 of the box 2 until a first vacuum condition with a first gas pressure (an absolute pressure less than 1 [Bar]) is obtained (see FIG. 5B);

creating the transfer opening between the inner space 10 of the box 2 and the inner space 54 of the load lock (connecting the inner spaces), wherein inner space 54 is already in a second vacuum condition with a second gas pressure (for example under an absolute gas pressure of less than $10^{-4}$ milliBar [mBar]), which is lower than the first gas pressure; and transferring patterning device 4 from the inner space 10 through the patterning device transfer opening into the inner space 54 (see FIG. 6).

It is possible to evacuate the box before the coupling. However, it is preferred to evacuate the box when the box is coupled to the load lock, since then evacuating can be performed via the coupled channel systems which are the connected to the evacuation device located at the load lock.

Coupling the Box with the Load Lock

Figure 4B:
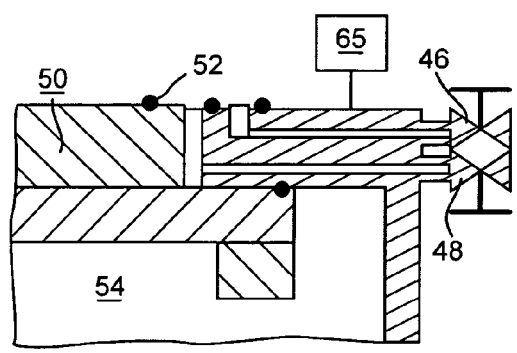
FIG. 4B is a detailed view of a portion of FIG. 4A.
Figure 4A:
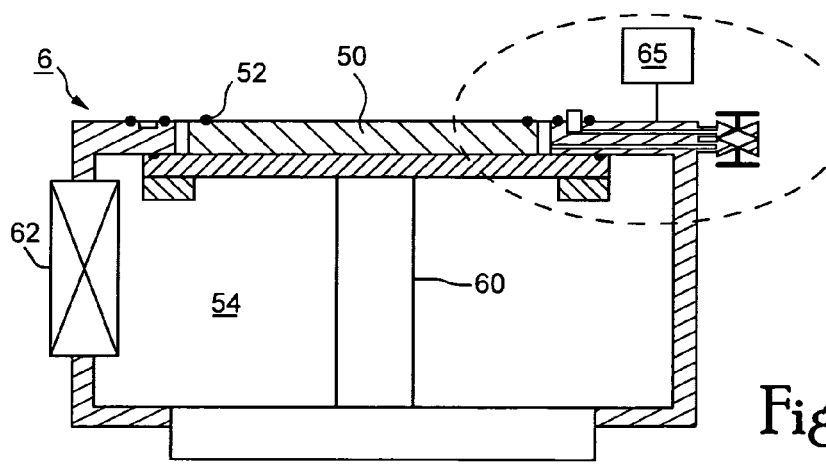
FIG. 4A is a schematic side view of a vertical oriented cross section of a load lock according to the invention.

During the coupling the box 2 with the load lock 6 (FIG. 5A), the input channel 26 is coupled to the first channel 42 closed by the first valve 46, and the output channel 20 is coupled with the second channel 44 closed by the second valve 48. During the coupling, the load lock 6 automatically opens the input valve 30 and the output valve 24. As shown in FIG. 4A, the first and second channels 42, 44 are part of the load lock 6. After the coupling, the first channel 42 is closed by the first valve 46, and the second channel 44 is closed by the second valve 48.

During the coupling, the space defined by the closure part 14, the closure member 50, and the seal 52 is evacuated in order to establish a thorough connection and to keep contamination particles caught in the said space. In addition, a locking and pressing mechanism (e.g., a rotatable pin with a protrusion connected to a spring, wherein the pin can be rotated in order to lock the closure parts together under the pressing force of the spring) can be applied for securing the thorough connection even under vacuum conditions.

Evacuating the Box

For the evacuation, use is made of an evacuation device (e.g., vacuum pump) connected to the second channel 44, wherein the second valve 48 is opened such that the pump can evacuate gasses from the box 2. In one embodiment the load lock 6 is provided with a permanent evacuating device such as a dedicated vacuum pump connected to the second channel 44. The direction of the gas flow follows the arrows indicated in FIG. 5B. This gas flow is directed from the first compartment 34.1 to the second compartment 34.2. The EUV patterning device 4 contains a pattern on a side (bottom side) which faces the table 13, such that the direction of the gas flow is directed away from the pattern which is favorable since the chance of contamination is thereby optimally reduced.

After evacuation a situation can be reached whereby the gas pressure of the first vacuum condition is less than about an absolute pressure of 5 milliBar [mBar]. After evacuating the box 2, the valve 48 is closed.

Transferring the Patterning Device

After the coupling and the evacuation, the patterning device 4 and the table 13 are transferred into the load lock 6. This is performed by lowering the ensemble 56 by means of the elevator 60, wherein a patterning device transfer opening is created between the inner space 10 and the inner space 54 through which the patterning device are fed. The inner spaces 10 and 54 are now connected via the patterning device transfer opening.

It is noted that the connected or combined inner spaces are vacuum sealed from external environment 66 (see FIG. 6). Just before connecting the inner spaces 10 and 54 for performing the transfer of the patterning device, the inner space 10 was in the first vacuum condition with a low gas pressure such that the gas flow through the patterning device transfer opening is reduced to a minimum compared with a conventional situation wherein the inner space 10 is at atmospheric pressure just before the transfer. This has a first advantage of a reduced risk of knocked loose contamination particles. A second advantage is that there is no need to evacuate (much) gas from the second inner space 54 after creation of the patterning transfer opening. Therefore, time is saved and the throughput of the lithographic system is optimized.

In the situation depicted in FIG. 6, the coupled closure part 14 and the closure member 50 are moved (by the elevator mechanism 60) in the vacuum condition of the then connected inner spaces such that the vacuum condition in the space between the closure part 14, the closure member 50 and the seal 52 is mostly no longer enough to guarantee a thorough connection. Therefore, it is of interest that the already discussed locking and pressing mechanic keeps the closure parts under (mechanical) pressure against each other in order to maintain the connection thereby keeping the contamination particles caught in the space.

Figure 7:
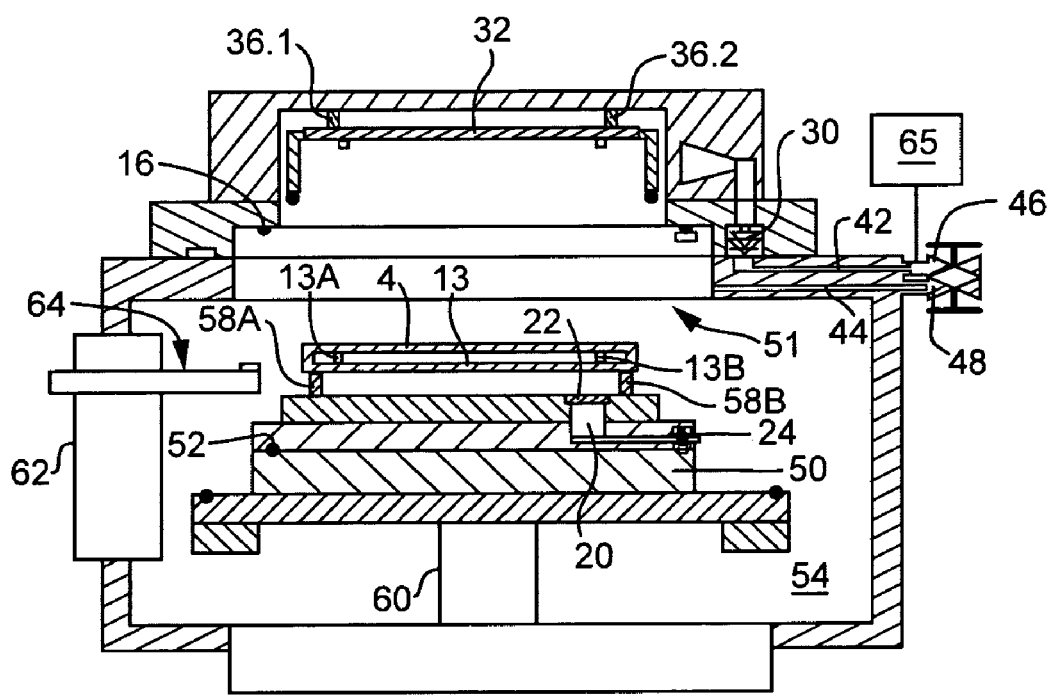
FIG. 7 is a schematic side view of the system according to FIG. 5A, depicted in a situation wherein the patterning device are exchanged between the system and an lithographic exposure unit coupled to the system.

In the situation of FIG. 7 the patterning device 4 have been transferred into the load lock 6. The placing equipment 62 can transport the patterning device 4 from the load lock 6 to the exposure unit. After usage, the patterning device are returned by the placing equipment 62 and placed, together with the table 13, on the carrying elements 58A, 58B (FIG. 7). Next, the elevator mechanism 60 rises the ensemble 56 untill both the box and the load lock are closed (FIG. 8A).

Figure 8B:
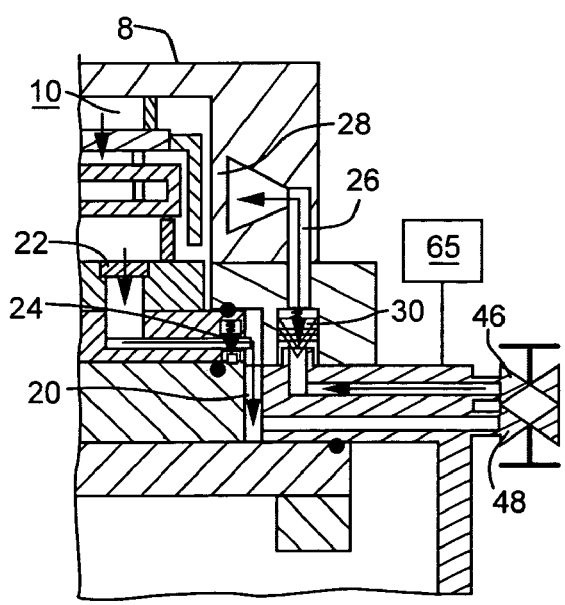
FIG. 8B is a detailed view of a portion of FIG. 8A.

Finally, the first valve 46 is opened and suitable gas is supplied to the first channel 42, through the input channel 26, into the inner space 10. In this way, the box is filled with gas (for example under an atmospheric pressure, see FIG. 8B). This is called venting of the box 2. Since the input channel 26 is provided with the gas filter 28, possible contamination particles present in the gas will be filtered out. Preferably, however, the channel 42 is connected to a clean gas supply device such that clean, particle free, gas is supplied through the channels 42, 26. During venting, the gas flow is as indicated with the arrows in FIG. 8A. This gas flow is in the same direction as the gas flow during evacuation. Note that the load lock 6 maintains the second vacuum condition in its inner space 54.

While specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A box for transporting a lithographic patterning device, the box comprising:
   a container part having an inner space with a storing position to store the patterning device and an opening to transfer the patterning device to and from the inner space;
   a closure part to close the opening; and
   a channel system connected to the inner space and constructed and arranged to be coupled to a channel system that is external to the box to evacuate and/or feed gases from/to the inner space of the box,
   wherein the box is arranged to cooperate with a lithographic apparatus for a transfer of the patterning device through the opening.

2. The transport box of claim 1, wherein the box is provided with a vacuum seal between the container part and the closure part to provide a substantially gas-tight closing by the closure part.

3. The transport box of claim 1, wherein the channel system comprises an output channel connected to the inner space that is connectable with an external evacuating device to evacuate gas from the inner space, the output channel being provided with a particle filter and an output valve to close the output channel.

4. The transport box of claim 1, wherein the channel system comprises an input channel connected to the inner space that is connectable with an external feeding device to feed gas into the inner space, the input channel being provided with a particle filter and an input valve to close the input channel.

5. The transport box of claim 1, wherein the inner space is provided with a separation member comprising a filter and/or a gas permeable sheet, the separation member defining a first and a second compartment within the inner space in order to provide protection against possible contamination in the first compartment when the patterning device is placed in the storage position located in the second compartment.

6. The transport box of claim 5, wherein the separation member is oriented substantially horizontal, the first compartment is located above the second compartment, and the channel system is arranged such that the input channel flows into the first compartment and the output channel flows out from the second compartment.

7. The transport box of claim 1, wherein the channel system is configured to evacuate gas from the inner space before transferring the patterning device from the inner space to the lithographic apparatus.

8. The transport box of claim 1, wherein the channel system of the box is configured to cooperate with a channel system of the lithographic apparatus when the box is coupled to the lithographic apparatus.

9. An apparatus for handling a patterning device and capable of cooperating with a box for transporting a patterning device, said transport box having a transport box channel system, said apparatus comprising:
   a support structure configured to support the patterning device; and
   a channel system configured to be coupled to the transport box channel system,
   wherein the transport box channel system is configured to evacuate gases from/to an inner space of the transport box and/or to feed gases to/from the inner space of the transport box.

10. A box for transporting a lithographic patterning device, the box comprising:
    a container part having an inner space with a storing position to store the patterning device and an opening for transferring the patterning device to and from the inner space;
    a closure part to close the opening; and
    a channel system configured to evacuate and/or feed gases from/to the inner space of the box, the channel system including an output channel connected to the inner space, the output channel connectable with an evacuating device that is external to the box and configured to evacuate gas from the inner space,
    wherein the box is arranged to cooperate with a lithographic apparatus for a transfer of the patterning device.

11. A box for transporting a lithographic patterning device, the box comprising:
    a container part having an inner space with a storing position to store the patterning device and an opening for transferring the patterning device to and from the inner space;
    a closure part to close the opening; and
    a channel system configured to evacuate and/or feed gases from/to the inner space of the box, the channel system including an input channel connected to the inner space, the output channel connectable with a feeding device that is external to the box and configured to feed gas into the inner space,
    wherein the box is arranged to cooperate with a lithographic apparatus for a transfer of the patterning device.

* * * * *